United States Patent [19]

Daubenspeck

[11] Patent Number: 4,836,886
[45] Date of Patent: Jun. 6, 1989

[54] BINARY CHLOROFLUOROCARBON CHEMISTRY FOR PLASMA ETCHING

[75] Inventor: Timothy H. Daubenspeck, Colchester, Vt.

[73] Assignee: International Business Machines Corporation, Armonk, N.Y.

[21] Appl. No.: 123,639

[22] Filed: Nov. 23, 1987

[51] Int. Cl.[4] .............................. C23F 1/02; C23F 1/12
[52] U.S. Cl. ..................................... 156/643; 156/646; 156/656; 156/659.1; 156/664; 252/79.1
[58] Field of Search ............... 156/643, 646, 656, 657, 156/659.1, 662, 664; 252/79.1

[56] References Cited

U.S. PATENT DOCUMENTS

| Re. 30,505 | 2/1981 | Jacob | 156/643 |
|---|---|---|---|
| 3,923,568 | 12/1975 | Bersin | 156/643 |
| 3,951,709 | 4/1976 | Jacob | 156/643 |
| 4,026,742 | 5/1977 | Fujino | 156/643 |
| 4,180,432 | 12/1979 | Clark | 156/643 |
| 4,267,013 | 5/1981 | Iida et al. | 156/643 |
| 4,314,875 | 2/1982 | Flamm | 156/643 |
| 4,353,777 | 10/1982 | Jacob | 156/643 |
| 4,374,698 | 2/1983 | Sanders et al. | 156/643 |
| 4,473,436 | 9/1984 | Beinvogl | 156/643 |
| 4,475,982 | 10/1984 | Lai et al. | 156/643 |
| 4,547,261 | 10/1985 | Maa et al. | 156/643 |
| 4,720,322 | 1/1988 | Tiffin | 156/643 |

OTHER PUBLICATIONS

Coburn et al., "Plasma Etching—A Discussion of Mechanisms", *J. Vac. Sci. Tech.*, vol. 16, No. 2, Mar. Apr. 1979, pp. 391–403.

Coburn, "Plasma-Assisted Etching", *Plasma Chemistry and Plasma Processing*, vol. 2, No. 1, 1982, pp. 1–41.

"Blanket CVD Tungsten Interconnect for VLSI Devices," S. Mehta et al., 1986 *Proceedings 3rd International IEEE VLSI Multilevel Interconnection Conference*, Santa Clara, Calif., Jun. 9–10, 1986, pp. 418–435.

"RF Sputter-Etching by Fluoro-Chloro-Hydrocarbon Gases," N. Hosokawa et al., *Japan J. Appl. Phys.*, Suppl. 2, Pt. 1, 1974, p. 435.

"Selective Dry Etching of Tungsten for VLSI Metallization," M. E. Burba et al., *Journal of the Electrochemical Society: Solid State Science and Technology*, Oct. 1986, pp. 2113–2118.

*Primary Examiner*—David L. Lacey
*Assistant Examiner*—Andrew J. Anderson
*Attorney, Agent, or Firm*—Mark F. Chadurjian

[57] ABSTRACT

A plasma comprised of trifluorochloromethane and an oxidant etches non-insulating materials such as tungsten at very high etch rates when the oxidant comprises at least 50% of the plasma by volume.

4 Claims, No Drawings

BINARY CHLOROFLUOROCARBON CHEMISTRY FOR PLASMA ETCHING

CROSS-REFERENCE TO RELATED APPLICATIONS

Reference is made to co-pending U.S. patent application Ser. No. 031,813, now U.S. Pat. No. 4,786,360 entitled "Anisotropic Etch Process for Tungsten Metallurgy," filed Mar. 30, 1987 by Cote et al and assigned to the assignee of the present invention. The application relates to a $Cl_2/O_2$ chemistry ($O_2=25\%-45\%$ of the mixture by flow rate) that anisotropically etches tungsten-based metallurgies at high etch rates and high etch rate ratios to underlaying dielectric layers.

Reference is also made to co-pending U.S. patent application Ser. No. 123,640, entitled "Chlorofluorocarbon Additives For Enhancing Etch Rates In Fluorinated Halocarbon/Oxidant Plasmas," filed by T. Daubenspeck et al and assigned to the assignee of the present invention. The application relates to $CF_4/O_2$ or $CHF_3/O_2$ plasmas having up to 15-20% added $CCl_2F_2$ or $CF_3Cl$ to enhance the etch rate of tungsten or silicon.

TECHNICAL FIELD

The invention relates to a plasma chemistry that is useful for etching various materials.

BACKGROUND ART

Plasma etching has replaced wet etching as the method of choice for delineating patterns within the various layers that form integrated circuits. In general, plasmas provide higher etch rates, greater anisotropy (i.e., more vertical profiles), and lower foreign material concentrations as compared to wet etchants. In plasma etching, a gas (or a combination of gases) is ionized to form a plasma. Depending on the conditions of the system (e.g., pressure, power, bias to the electrodes, etc.) as well as the nature of the ions, the exposed material can be etched in a "physical" mode, a "chemical" mode, or a mode that is both physical and chemical. In the physical etch mode, the ions are inert with respect to the exposed material, and they have sufficient energy to physically dislodge atoms from the exposed surface. In the chemical mode, the ions do chemically react with the exposed surface to form gaseous reaction products that are pumped away. In reactive ion etching (RIE) both physical and chemical etching takes place. That is, while the ions chemically react with the surface, they have sufficient energy to enhance the rate of reaction as a function of the angle between the exposed surface and the direction of ion bombardment.

Various combinations of gases have been disclosed for producing these plasmas. Prominent among these combinations have been those that include the halogen gases, particularly chlorine and fluorine. These gases produce ions that readily react with exposed surfaces, enhancing the rate of formation of volatile reaction products.

U.S. Pat. No. RE 30,505, entitled "Process and Material for Manufacturing Semiconductor Devices," originally filed May 12, 1972 by Jacob, reissued Feb. 3, 1981, and assigned to LFE Corporation, relates to a binary mixture of $CF_4/O_2$ for etching silicon oxide, silicon nitride, tungsten, and molybdenum. The patent also discloses the use of $CHF_3/O_2$ and $C_2F_3Cl_3/O_2$. ($O_2=75\%$ of the total gas mixture) to etch silicon oxide. The patent teaches that $O_2$ concentrations up to 25% are preferred, in that at higher $O_2$ percentages the overlaying photoresist masking layer will be appreciably etched.

U.S. Pat. No. 3,951,709, entitled "Process and Material for Semiconductor Photomask Fabrication," filed 2/28/74 by Jacob, issued April 20, 1976, and assigned to the LFE Corporation discloses a plurality of binary plasma chemistries (i.e., organic chlorine compounds mixed with oxygen, inorganic chlorine compounds mixed with oxygen) that are useful to etch chromium or gold metallurgies. Among these etch compositions is a binary mixture of chlorine gas and oxygen, wherein oxygen comprises between 40-80% of the mixture. $CFCl_3$ is cited as one of the possible organic chlorine compounds that can be used.

As shown by the above-cited patents, chlorofluorocarbons molecules (i.e., molecules in which carbon atoms are linked to both fluorine and chlorine atoms) have been used as plasma components. More specifically, chlorofluorocarbons acting alone have been used to generate plasmas that etch various materials. See U.S. Pat. No. 4,026,742 ($CCl_2F_2$ in an inert carrier gas is used to etch metals such as tungsten and molybdenum by converting them into metal fluorides that are subsequently removed by wet etching); U.S. Pat. No 4,353,777 (experiments using $CF_3Cl$, $CF_2Cl_2$, and $CFCl_3$ plasmas to etch polysilicon established $CFCl_3$ having the highest average etch rate ratio to an underlaying glass layer at chamber pressures of 50-150 mTorr and power densities of 0.24-1.96 $W/cm^2$); U.S. Pat. No. 4,473,436 ($CCl_2F_2$ or $CFCl_3$ is used with an inert carrier gas to etch a composite of polysilicon and metal silicide with an $SF_6/Cl_2$ combination being preferred); U.S. Pat. No. 4,405,406 ($CHCl_2F$ is used to etch polysilicon at a high etch ratio to photoresist rate at chamber pressures of 150-400 mTorr and power densities of 0.1-0.4 $W/cm^2$); and an article by Hosokawa et al, entitled "RF Sputter-Etching by Fluoro-Chloro-Hydrocarbon Gases," Japan J. Appl. Phys., Suppl. 2, Pt. 1, 1974, p. 435 (chlorofluorocarbons such as $CFCl_3$ and $CCl_2F_2$ are used to etch silicon at 20 mTorr and 1.3 $W/cm^2$, to provide an etch rate of 1670 Å/mn and 220 Å/mn, respectively. The etch rate of molybdenum in $CCl_2F_2$ is 836 Å/mn).

Moreover, as shown in the above-cited LFE patents, chlorofluorocarbons have also been used in various binary combinations with oxygen or other active additives. See an article by Burba et al, entitled "Selective Dry Etching of Tungsten for VLSI Metallization," *Journal of the Electrochemical Society: Solid State Science and Technology* October 1986, pages 2113-2118, (tungsten is etched in $CF_4/O_2/He$, $CClF_3/O_2/He$ and $CBrF_3/O_2/He$ plasmas. In the $CClF_3/O_2/He$ chemistry, the tungsten etch rate increased as the oxygen concentration rose from zero to 15 percent, above which the etch rate appears to level off at approximately 275 Å/mn in a single wafer tool having a radio frequency (RF) excited plasma at a power density of 0.22 $W/cm^2$ and a pressure of 160 mTorr. The etch rate of $SiO_2$ stayed relatively constant). See also U.S. Pat. No. 4,314,875 (the etch rate of a material such as photoresist in halocarbon plasmas such as ($CF_2Cl_2$ and $CF_3Cl$ that normally produce unsaturated by-products is enhanced by the 20% addition of an oxidant such as $O_2$, $NF_3$, etc. that combines with the unsaturated by-products and removes them from the reaction); U.S. Pat. No. 4,374,699 (addition at least 25% $CO_2$ or NO to a $CF_3Cl$ plasma to enhance the removal of photoresist relative to polysilicon); and U.S. Pat. No. 3,923,568 (etching gold, platinum, palladium, or silver in $CCl_2F_2$ with not more than 25% oxygen to retard photoresist removal while enhancing etch rate).

Finally, various ternary compositions (consisting of a chlorofluorocarbon, a halogen, and an oxidant material) have been proposed for etching various materials. In U.S. Pat. No. 4,267,013, aluminum is patterned in a plasma comprised of boron trichloride, oxygen, and a halocarbon such as $CCl_2F_2$. The halocarbon constitutes between 10% and 32% of the total mixture. The halocarbon enhances the etch rate of aluminum in $BCl_3$ In U.S. Pat. No. 4,547,261, aluminum is patterned in a plasma comprised of boron trichloride, nitrogen, and a chlorofluorocarbon. The chlorofluorocarbon constitutes between 8% and 50%, preferably between 12% and 40%, of the mixture. The chlorofluorocarbon is added to passivate the sidewalls of the reactive chamber during the etch, thus minimizing contaminants. In U.S. Pat. No. 4,374,698, layers of silicon oxide and silicon nitride are etched in a $CF_4+O_2$ plasma having 1%–15% $CF_3Br$ or $CCl_2F_2$. The latter gases retard the etch rate of silicon oxide much more than they retard the etch rate of silicon nitride, thus enhancing the etch selectively between the two layers. Finally, an article by Metha et al, entitled "Blanket CVD Tungsten Interconnect for VLSI Devices," 1986 *Proceedings 3rd International IEEE VLSI Multilevel Interconnection Conference*, Santa Clara, California, June 9–10, 1986, pages 418–435, discloses the use of ternary plasma gas chemistry comprised of $SF_6/CCl_4/O_2$ to anisotropically etch CVD tungsten. The authors noted that $SF_6$ alone produced poor etch anisotropy, which was remedied by adding $CCl_4$. Oxygen was added in order to enhance the etch selectivity to the underlaying P-doped glass.

Currently, fluorine-based chemistries are used to etch semiconductors and conductors such as tungsten. These chemistries present a high etch rate selectivity to photoresist. However, these fluorine-based chemistries do not provide high etch rates without substantially increasing the energy of the plasma. Increasing the energy of the plasma makes the process more expensive to run while decreasing the etch selectivity to photoresist. While chlorine-based chemistries provide higher etch rates at conventional power densities, they provide a reduced etch selectivity to photoresist.

Accordingly, there is a need in the art for a gaseous plasma that provides both high etch rates and high etch rate ratios to photoresist.

SUMMARY OF THE INVENTION

The invention provides a binary chlorofluorocarbon/oxidant plasma chemistry that etches materials at high etch rates. Moreover, the same general conditions that maximize etch rate (i.e., high oxidant percentage) also maximize etch rate selectivity to photoresist.

DESCRIPTION OF THE BEST MODE FOR CARRYING OUT THE INVENTION

In considering the nature of the reactions inherent in etching various materials in $CF_4/O_2$ plasmas, the inventor came upon a chlorofluorocarbon/oxygen chemistry that produced results heretofore unreported. By carrying out an etch in $CClF_3/O_2$ where 02 is on the order of 50% or more of the total mixture, the etch rate of materials such as tungsten is greatly enhanced. Moreover, in this same general regime the photoresist etch rate is reduced relative to $CF_4/O_2$ plasmas, such that the etch rate ratio to photoresist is maximized.

The following Table 1 presents the results of experiments that verified the properties of the invention.

All experiments were carried out on a commercially available multi-wafer etch tool (i.e., a Plasmatherm PK24 batch reactor having 20.5 in. diameter parallel aluminum plates separated by a distance of 7 cm). The upper electrode was coated with a layer of photoresist to minimize aluminum sputtering. The photoresist was a phenolformaldeyde resin having a diazonaphthoquinone sensitizer, as generally described in U.S. Pat. No. 3,201,239. The chamber was conditioned to carry out the etches in a reactive ion etch (RIE) mode, wherein the substrate electrode is powered and the chamber pressure is maintained at 55 mTorr. The tool power was set at 300W. The total gas inlet flow was maintained at 120 SCCM. All runs involved etching a single blank four inch wafer located next to a view port at one of eleven wafer locations within the reactor. Optical emission spectra were collected at the view port adjacent to the test wafer for all runs. Tungsten blanks were prepared by deposition of 2 micron films on silicon using a Genus chemical vapor deposition (CVD) reactor. Two micron thick films of photoresist were prepared and etched for rate measurement and selectivity calculation. Substrate temperature was held at 20°–25° C. for all runs and was monitored directly using a fluoroptic probe contacting the underside of the etching wafer. Tungsten etch rates were obtained gravimetrically and converted to units of length/time using the CVD tungsten film density (25 g/cm$^3$) and the wafer area. Photoresist etch rates were determined directly by optical measurement.

TABLE 1

| RUN | $CF_4$ % | $CClF_3$ % | $CCl_2F_2$ % | $O_2$ % | W ER Å/MN | ERR-P |
|---|---|---|---|---|---|---|
| A1 | — | 100 | — | — | 50 | 0.50 |
| A2 | — | 95 | — | 5 | 75 | — |
| A3 | — | 90 | — | 10 | 120 | — |
| A4 | — | 80 | — | 20 | 200 | 1.10 |
| A5 | — | 70 | — | 30 | 280 | — |
| A6 | — | 60 | — | 40 | 400 | 1.55 |
| A7 | — | 50 | — | 50 | 540 | — |
| A8 | — | 40 | — | 60 | 750 | 2.17 |
| A9 | — | 30 | — | 70 | 1025 | 2.34 |
| A10 | — | 20 | — | 80 | 1210 | 2.25 |
| A11 | — | 10 | — | 90 | 1050 | 1.70 |
| A12 | — | 5 | — | 95 | 650 | — |
| A13 | — | 2 | — | 98 | 380 | <0.05 |
| B1 | 100 | — | — | — | 75 | 0.35 |
| B2 | 90 | — | — | 10 | 200 | 0.60 |
| B3 | 80 | — | — | 20 | 370 | 0.88 |
| B4 | 70 | — | — | 30 | 500 | — |
| B5 | 60 | — | — | 40 | 375 | 0.50 |
| B6 | 40 | — | — | 60 | 110 | 0.10 |
| B7 | 20 | — | — | 80 | 60 | <0.05 |
| C1 | — | — | 80 | 20 | 40 | — |
| C2 | — | — | 60 | 40 | 110 | — |
| C3 | — | — | 40 | 60 | 140 | — |
| C4 | — | — | 20 | 80 | 75 | — |

The experiments revealed that $CClF_3$ provided properties not presented by either $CF_4$ or $CCl_2F_2$ when etching tungsten in combination with oxygen. The peak etch rate in $CClF_3/O_2$ (run A10-1210 Å/mn) is almost 2.5 times as great as the peak etch rate in $CF_4/O_2$ (run B4- 500 Å/mn) and is 8.5 times as the peak etch rate in $CCl_2F_2$ (run C3 - 140 Å/mn). Moreover, the peak etch rate ratio of W:photoresist in $CClF_4/O_2$ (run A9 -2.35) is more than 2.5 times as great as that in $CF_4/O_2$ (run B3

- 0.88). Note the differing halocarbon concentrations at which peak etch rates were achieved - 20% $CClF_3$ in $O_2$ and 80% $CF_4$ in $O_2$, respectively. In fact, at high halocarbon concentrations the tungsten etch rate in $CF_4/O_2$ exceeds the etch rate in $CClF_3/O_2$ (above approximately 60% halocarbon in oxygen).

The comparative results between $CCl_2F_2/O_2$ and $CClF_3/O_2$ reveal that the simple simultaneous presence of C, Cl, F, and O atoms and ions does not provide the observed results. This is collaborated by the Burba and Mehta papers, neither of which report higher etch rates in such plasmas. Rather, it appear that the ratio between these ion species is of importance. More specifically, it appears important to have more fluorine than chlorine present in the chlorofluorocarbon, while having at least some chlorine. If there is not enough chlorine ($CF_4/O_2$ or too much chlorine ($CCl_2F_2$), the results of the invention are not achieved.

In the inventor's co-pending U.S. patent application Ser. No. 123,640, it was found that both $CF_3Cl$ and $CF_2Cl_2$ produced enhanced etch rates when added to $CF_4/O_2$ and $CHF_3/O_2$ discharges. It appears that these results are consistent with those observed above; that is, in a halocarbon/oxygen plasma, the greater amount of fluorine compensates for the greater amount of chlorine presented by the $CF_2Cl_2$. However, note that as additives to the fluorinated halocarbon/oxygen etch, the chlorofluorocarbons produce enhanced etch rates throughout the range of halocarbon/oxygen percentages; in the present invention the $CF_3Cl/O_2$ plasma produced enhanced etch rates for $O_2$ percentages of greater than 50%. Perhaps as the absolute amount of fluorine increases (e.g., the ternary case), the same reactions as normally occur in the halocarbon/oxygen plasma occur at an enhanced rate; while as the absolute amount of fluorine decreases, a reaction that more directly involves the oxidant ions species takes place.

While the invention was carried out with reference to tungsten, the plasma of the invention could be applied to etch other non-insulating materials (e.g., silicon, etc.) and other tungsten-based materials (e.g., $WSi_2$) that normally are etched in halocarbon/oxygen plasmas. This is supported by spectral studies showing that the same general amounts of reactive species generated in the $CF_4/O_2/CCl_2F_2$ plasma that etched silicon are also present in the $CF_3Cl/O_2$ plasma. Moreover, while the present invention was described with reference to oxygen as the oxidant, other oxidant materials (e.g., oxygen-containing materials such as $CO_2$, $N_2O$, etc.), could be used in combination with the chlorofluorocarbon of the invention.

I claim:

1. A method of etching a tungsten or tungsten alloy film, comprising the step of exposing said film to a plasma comprised of a chlorofluorocarbon gas and an oxidant gas, wherein said chlorofluorocarbon has more fluorine than chlorine, and wherein said oxidant gas comprises approximately 60%-90% of said plasma by volume.

2. A method of etching a tungsten film, comprising the step of exposing said film to a plasma comprising a binary mixture of trifluorochloromethane and oxygen, wherein oxygen comprises approximately 50%-90% of said plasma by volume.

3. A method of etching a tungsten film in the presence of polymer film at an etch rate ratio of at least 2:1, respectively, comprising the step of exposing said films to a binary plasma comprising trifluorochloromethane and oxygen, wherein oxygen comprises between approximately 60%-80% of said plasma by volume.

4. The method as recited in claim 3, wherein said method is carried out in a reaction chamber at a pressure of 55 mTorr.

* * * * *